United States Patent [19]

Suzuki

[11] 4,274,058

[45] Jun. 16, 1981

[54] AMPLIFIER WITH SEPARATE AC AND DC FEEDBACK LOOPS

[75] Inventor: Tadao Suzuki, Tokyo, Japan

[73] Assignee: Sony Corporation, Tokyo, Japan

[21] Appl. No.: 30,388

[22] Filed: Apr. 16, 1979

[30] Foreign Application Priority Data

Apr. 18, 1978 [JP] Japan ................................ 53/45618

[51] Int. Cl.³ .............................................. H03F 3/45
[52] U.S. Cl. .................................. 330/253; 330/254; 330/259; 330/260; 330/300
[58] Field of Search ..................... 330/90, 91, 92, 253, 330/254, 259, 260, 300

[56] References Cited

U.S. PATENT DOCUMENTS 3,419,809   12/1968   Lach et al. ........................ 330/259 X

OTHER PUBLICATIONS

Dereniak et al., "Low-Noise Preamplifier For Photoconductive Detectors," *Review of Scientific Instruments,* vol. 48, No. 4, Apr. 1977, pp. 392–394.

*Primary Examiner*—James B. Mullins
*Attorney, Agent, or Firm*—Hill, Van Santen, Steadman, Chiara & Simpson

[57] ABSTRACT

An amplifier with separate AC and DC feedback loops is disclosed, in which first and second bipolar transistors or field effect transistors (FET) are connected differentially, a resistor is inserted between the emitters or sources of the first and second transistors, the base or gate of the first transistor is supplied with an input signal, the DC component of an output is fed back to the base or gate of the second transistor, the AC component of the output is fed back to the emitter or source of the second transistor to change over the feeding back amount of the AC component.

11 Claims, 3 Drawing Figures

4,274,058

AMPLIFIER WITH SEPARATE AC AND DC FEEDBACK LOOPS

BACKGROUND OF THE INVENTION

1. Field of the Invention:

This invention relates generally to an amplifier with separate AC and DC feedback loops which is suitable for use as a first stage amplifier for a reproduced signal by a record player in which both of a moving coil type cartridge and a moving magnet type cartridge can be used, and is directed more particularly to an amplifier with separate AC and DC feedback loops which can produce a stable output signal regardless of the variation of a power source voltage.

2. Description of the Prior Art:

In general, the reproduced output signal voltage from a moving coil type cartridge is smaller than the reproduced output signal voltage from a moving magnet type cartridge by more than 20 dB. Therefore, in a record player which can use both of the moving coil type cartridge and moving magnet type cartridge, it is necessary that when the moving coil type cartridge is used, a low noise head amplifier for the moving coil type cartridge be used. The use of such a low noise head amplifier results in the record player becoming complicated in construction, high in cost, with a disadvantage being caused in view of the maximum input voltage being required.

To avoid this disadvantage, in the art there has already been proposed a circuit as shown in FIG. 1, in which by changing the gain of an equalizer amplifier the output signal from both the moving magnet and coil type cartridge can be processed and at the same time the gain of an open loop can be changed. This prior art circuit will be now described with reference to FIG. 1. In FIG. 1, an input terminal 1, which is supplied with the reproduced output signal from the moving coil or magnet type cartridge, is connected through a DC blocking capacitor 2 to the base of an NPN-type transistor 3 whose base is in turn grounded through a resistor 4. The transistor 3 is connected at its collector through a resistor 5 to a positive power voltage source terminal 6, which is supplied with a positive DC voltage +Vcc, and at its emitter is connected through a resistor 7 to a negative power voltage source terminal 8 which is supplied with a negative DC voltage −Vcc whose absolute value is equal to that of positive DC voltage +Vcc. The collector of the transistor 3 is connected also to the base of a PNP-type transistor 9, which is connected at its emitter to the positive voltage source terminal 6 through a parallel connection of a resistor 10 and a capacitor 11 and at its base to its collector through a capacitor 12. The collector of transistor 9 is connected through a capacitor 13 to an output terminal 14. The collector of transistor 9 is connected also to the emitter of transistor 3 through a feedback element 15 for obtaining the characteristics of an RIAA standard and also to the drain of a field effect transistor (which will be hereinafter referred to simply as an FET) 16 which will form a constant current circuit and also increase the gain of transistor 9. This FET 16 has the source connected through a resistor 17 to the negative voltage source terminal 8 and the gate connected to the negative voltage source terminal 8. The connection point between the emitter of transistor 3 and feedback element 15 is grounded through a series connection of a capacitor 18 and a resistor 19, and the connection point between capacitor 18 and resistor 19 is grounded through a series connection of a resistor 20 and a connection switch 21. In this case, it is selected that a resistance value R2 of resistor 7 be a great deal larger than that of R3 and R4 of resistors 19 and 20 and the ratio between resistance values R3 and R4 is selected to be 9:1. Further, in this case, the input impedance of the transistor 9 is selected much greater than a resistance value R1 of resistor 5.

With the prior art amplifier circuit of FIG. 1, when a moving magnet type cartridge is used, the connection switch 21 is open (i.e., OFF). At this time, the gain of transistor 3 becomes about R1/R3. When a moving coil type cartridge is used in the circuit of FIG. 1, the connection switch 21 is closed (i.e., ON). At this time, the gain of transistor 3 becomes about 10R1/R3 because R3:R4=9:1. Thus, when either one of the moving magnet and coil type cartridges is used, the circuit of FIG. 1 delivers an output signal with the same level to the output terminal 14. In the circuit of FIG. 1, when the connection switch 21 is closed, the gain of the closed loop increases by about 20 dB and also the gain of the open loop increases by about 20 dB. Thus, at this time, the negative feedback with the amount the same as that of the negative feedback upon the connection switch 21 being open is provided and hence the amplifier circuit of FIG. 1 has good stability.

However, in the circuit of FIG. 1, when the DC voltage −Vcc applied to the negative voltage source terminal 8 fluctuates, this fluctuation appears at the output terminal 14 as the resistance value R2 of resistor 7 relative to the impedance value of negatve feedback element 15 for the fluctuation. Further, it is necessary that the voltage at a connection point P between the collector of the transistor 9 and the drain of FET 16 is kept at the mid voltage between the voltage applied to the positive and negative voltage source terminals 6 and 8 or at zero volt in this example. However, the voltage at the connection point P is moved by the fluctuation or scattering of DC voltage −Vcc applied to the negative voltage source terminal 8 with the resistance value R2 of resistor 7 for the impedance value of feedback element 15, and hence it is difficult for the voltage at the connection point P to be kept at the mid voltage between that applied to the terminals 6 and 8, for example, zero volt.

OBJECTS AND SUMMARY OF THE INVENTION

Accordingly, it is an object of the invention to provide an amplifier free from the defects encountered in the prior art.

It is another object of the invention to provide an amplifier with separate AC and DC feedback loops for use in a record player.

According to an aspect of the present invention, there is provided an amplifier with separate AC and DC feedback loops which comprises a DC voltage source having first and second output terminals, first and second transistors differentially connected between the first and second output terminals of the DC voltage source and each having first, second and third electrodes, the first electrode of the first transistor being supplied with an input signal to be amplified, the second electrodes of the first and second transistors being connected to each other, the third electrode of the first transistor being connected to one of the first and second output terminals of the DC voltage source through a first load, a third transistor having first, second and third electrodes, the first electrode thereof being DC-coupled to the third electrode of the first transistor, the second electrode thereof being connected to the one ouput terminal of the DC voltage source and the third electrode thereof being connected to the other output terminal of the DC voltage source through a second load, a DC feedback circuit connected between the third electrode of the third transistor and the first electrode of the second transistor, and an AC feedback circuit connected between the third electrode of the third transistor and the second electrode of the first transistor.

The other objects, features and advantages of the present invention will become apparent from the following description taken in conjunction with the accompanying drawings through which the like references designate the same elements.

DESCRIPTION OF THE PREFERRED EMBODIMENTS

The present invention will be described with reference to the drawings.

Figure 1:
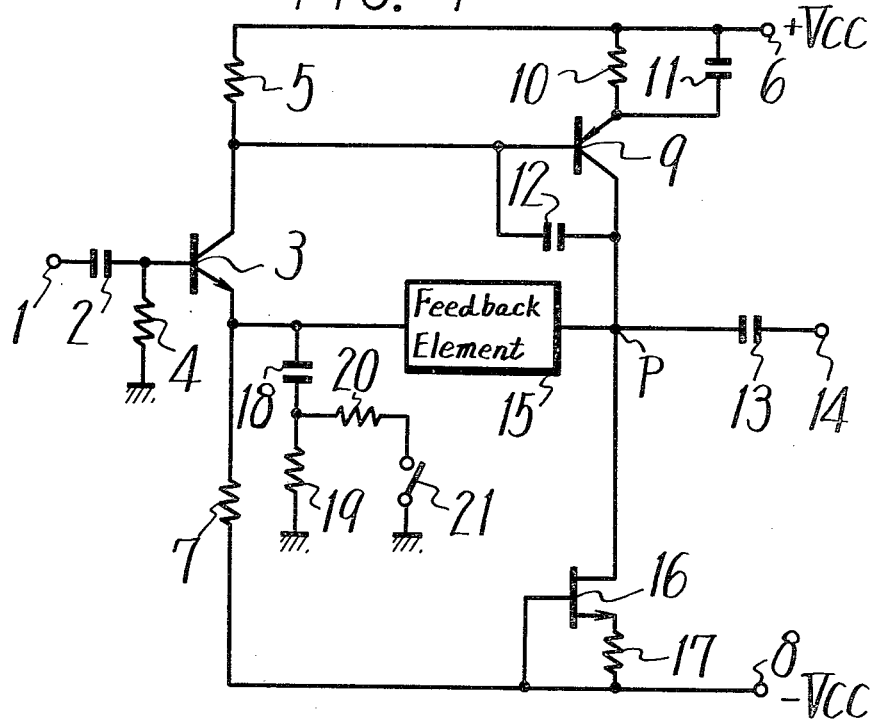
FIG. 1 is a connection diagram showing a prior art amplifier.
Figure 2:
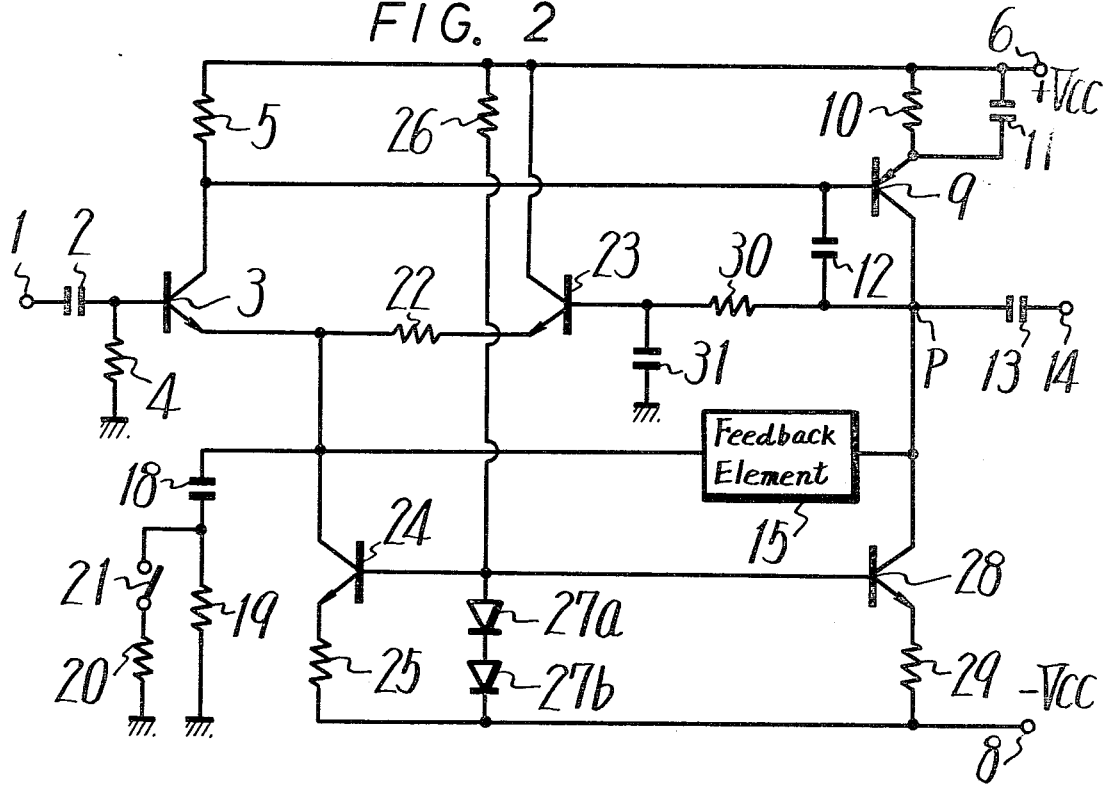
FIG. 2 is a connection diagram showing an example of the amplifier with separate AC and DC feedback loops according to the present invention.

FIG. 2 shows an example of the amplifier with separate AC and DC feedback loops according to the present invention in which reference numerals corresponding to those used in FIG. 1 designate the same elements and their detailed description will be omitted.

In the example of the invention shown in FIG. 2, the emitter of transistor 3 is connected through a resistor 22 to the emitter of an NPN-type transistor 23, which is connected in a differential amplifier type arrangement with transistor 3. The connection point between the emitter of transistor 3 and resistor 22 is connected to the collector of an NPN-type transistor 24 which forms a constant current source. The transistor 24 has its emitter connected to the negative voltage source terminal 8 through a resistor 25 and the base connected to the positive voltage source terminal 6 through a resistor 26 and to the negative voltage source terminal 8 through two diodes 27a and 27b which are connected in series in the forward direction so as to make the transistor 24 serve as the constant current source. The emitter of transistor 3 is grounded through the series connection of capacitor 18 and resistor 19 and the connection point therebetween is grounded through the series connection of connection switch 21 and resistor 20, similar to the arrangement shown in the prior art of FIG. 1. In this case, the resistance value of resistor 22 is selected to be relatively high, for example, higher than that of resistor 19 by several times. The collector of transistor 23 is connected to the positive voltage source terminal 6 and the collector of transistor 9 is connected to the collector of an NPN-type transistor 28 which forms a constant current source. The transistor 28 has the emitter connected to the terminal 8 through a resistor 29 and the base connected to the connection point between resistor 26 and diode 27a to make transistor 28 serve as the constant current source. The output terminal 14 is led out from the connection point P between the collectors of transistors 9 and 28 through the capacitor 13, and the connection point P is connected to the base of transistor 23 through a resistor 30. The base of transistor 23 is grounded through a capacitor 31 with respect to AC. The connection point P is also connected through the feedback element 15 for obtaining the characteristics of the RIAA standard to the connection point between the emitter of transistor 3 and resistor 22. In this case, the gain of the amplifier upon the connection switch 21 being OFF or opened, is determined by the resistance value of the parallel circuit of resistors 19, 22 and the resistance value of resistor 5 similar to the prior art amplifier of FIG. 1, while the gain of the amplifier upon the connection switch 21 being ON or closed is determined by the resistance value of the parallel circuit of resistors 19, 20, 22 and the resistance value of resistors 5. Thus, the gain of the amplifier upon the connection switch 21 being ON and OFF, is selected similarly to the prior art example of FIG. 1. Further, the input impedance of transistor 9 is selected higher than the resistance value of resistor 5.

In the example of the invention shown in FIG. 2, an input signal applied to the input terminal 1 is delivered through the transistors 3 and 9 to the output terminal 14 and a part of the signal appearing at the collector of transistor 9 is fed back through the feedback element 15 to the emitter of transistor 3. Thus, when the connection switch 21 is made ON and OFF similar to the prior art example of FIG. 1, the output voltages upon the moving magnet and coil type cartridges being used can be made substantially the same in level. Further, the DC component appearing at the collector of transistor 9 or the connection point P is fed back to the base of transistor 23 through resistor 30 and the transistors 23 and 3 are connected differentially, so that the DC component at the connection point P can be fixed to the mid voltage between the constant DC voltages applied respectively to the positive and negative voltage source terminals 6 and 8, i.e., zero volt.

Further, even when the DC voltage −Vcc applied to the negative terminal 8 is fluctuated, since this negative terminal 8 is connected through the transistors 28 and 24, which form the constant current source, to the emitter of transistor 3 and the collector of transistor 9, respectively, fluctuation of voltage at the negative terminal 8 is prevented by the constant current source. Therefore, this fluctuation of voltage at the terminal 8 hardly affects the output signal.

As set forth above, according to the amplifier circuit of the present invention, the effect similar to that achieved by the prior art equalizer amplifier circuit shown in FIG. 1 is achieved and, in addition thereto, the output signal which is stable regardless of the fluctuation of power source voltage can be developed. Further, since the DC component of the output signal is fed back, the DC component at the connection point P can be fixed to the mid voltage between the DC voltages applied to the terminals 6 and 8, respectively.

Figure 3:
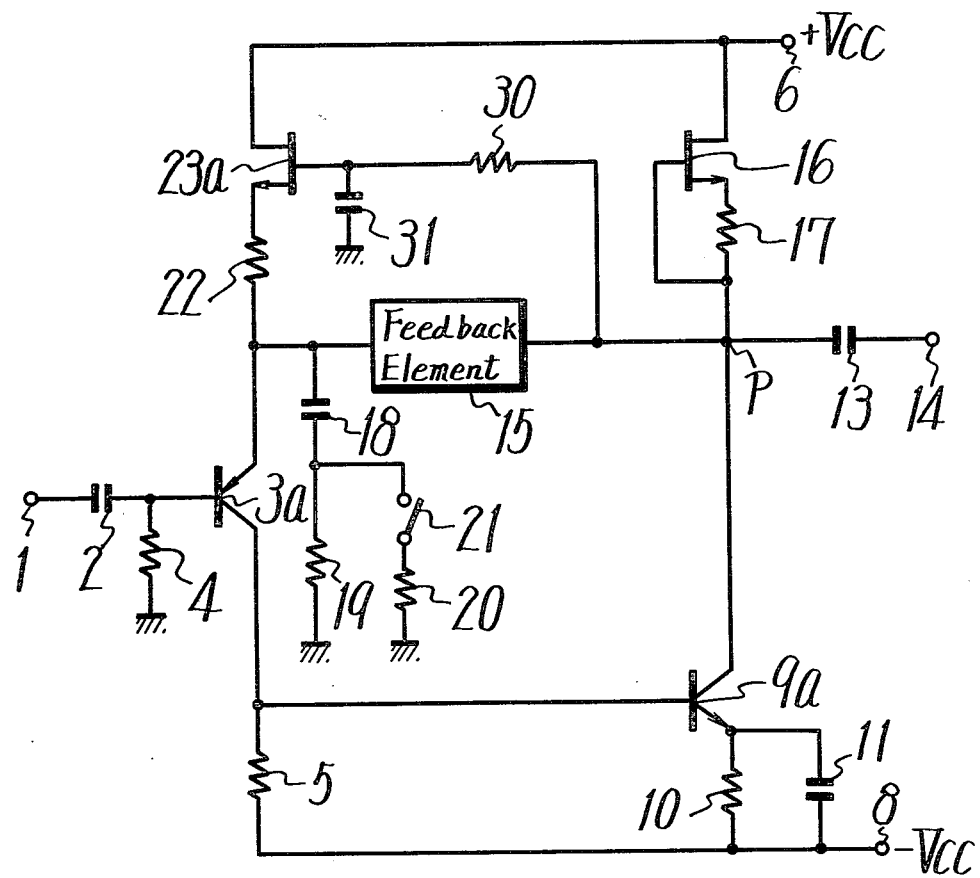
FIG. 3 is a connection diagram showing another example of the present invention.

FIG. 3 shows another example of the amplifier according to the invention. In the example of FIG. 3, the first stage is a complementary and differential amplifier which uses a FET and the constant current source used in FIG. 2 is omitted. In FIG. 3, the elements corresponding to those of FIGS. 1 and 2 are marked with the same reference numerals, and their detailed description will be omitted.

In the example of the invention shown in FIG. 3, the input terminal 1 is connected through the capacitor 2 to the base of a PNP-type transistor 3a which has its collector connected through the resistor 5 to the negative voltage source terminal 8 and also to the base of an NPN-type transistor 9a, which forms an amplifier. The transistor 9a is connected at its emitter to the negative voltage source terminal 8 through the parallel connection of the resistor 10 and capacitor 11 and at its collector through a resistor 17 to the source of the FET 16, which forms the constant current circuit and also increases the gain of transistor 9a, and also to the gate of FET 16. The output terminal 14 is led out from the collector of transistor 9a through capacitor 13. The emitter of transistor 3a is connected through resistor 22 to the source of an FET 23a of an N-channel which forms together with transistor 3a a complementary and differential circuit and which has the drain connected to the positive voltage source terminal 6. The collector of transistor 9a is connected through resistor 30 to the gate of FET 23a which gate is in turn grounded through capacitor 31 and connected through the resistor 30 and feedback element 15 to the emitter of transistor 3a whose emitter is grounded through the series connection of capacitor 18 and resistor 19. The connection point therebetween is also grounded through the series connection of connection switch 21 and resistor 20.

In the circuit of the invention shown in FIG. 3, the DC component of the signal obtained at the collector of the transistor 9a, i.e., at the connection point P of the output side is fed back to the gate of FET 23a through resistor 30 and capacitor 31 and also to the emitter of transistor 3a through feedback element 15 which serves to provide the characteristics of the RIAA standard, so that when the connection switch 21 is made ON or OFF, the reproduced signal applied from the moving coil or magnet type cartridge to the input terminal 1 can be delivered to the output terminal 14 as a signal with substantially constant level and also the DC component at the connection point P can be made constant. Further, the voltage fluctuation at the positive voltage source terminal 6 is prevented by FETs 16 and 23a and has hardly any affect on the output side or output signal and also the voltage fluctuation at the negative voltage source terminal 8 hardly affects the output signal because the collector resistance value of transistor 3a is high.

In the above examples of the invention, it is, of course, possible to use FETs in place of the transistors. In this case, it will be easily understood that the base, emitter and collector of the transistor correspond to the gate, source and drain of the FET, respectively.

It will be apparent that many modifications and variations could be effected by one skilled in the art without departing from the spirit or scope of the novel concepts of the present invention, so that the spirit or scope of the invention should be determined by the appended claims only.

I claim as my invention:

1. An amplifier with separate AC and DC feedback loops comprising:
   (a) a DC voltage source having first and second output terminals;
   (b) first and second transistors differentially connected between said first and second output terminals of said DC voltage source and each having first, second and third electrodes, the first electrode of said first transistor being supplied with an input signal to be amplified, the second electrodes of said first and second transistors being connected to each other, the third electrode of said first transistor being connected to one of the first and second output terminals of said DC voltage source through a first load;
   (c) a third transistor having first, second and third electrodes, the first electrode of said third transistor being DC-coupled to the third electrode of said first transistor, the second electrode of said third transistor being connected to said one output terminal of said DC voltage source, and the third electrode of said third transistor being connected to the other output terminal of said DC voltage source through a constant current source means.

2. An amplifier with separate AC and DC feedback loops as claimed in claim 1, in which said first to third transistors are each a bipolar transistor, and the first, second and third electrodes thereof are base, emitter and collector electrodes, respectively.

3. An amplifier with separate AC and DC feedback loops as claimed in claim 1, in which said first and second transistors are a bipolar transistor and a field effect transistor, respectively, and the first, second and third electrodes of said bipolar transistor are base, emitter and collector electrodes, respectively, and the first, second and third electrodes of said field effect transistor are gate, source and drain electrodes, respectively.

4. An amplifier with separate AC and DC feedback loops as claimed in claim 2, in which the connection point between the emitters of said first and second transistors is connected through a first constant current transistor to said other output terminal of said DC voltage source.

5. An amplifier with separate AC and DC feedback loops as claimed in claim 4, in which said constant current source means is a second constant current transistor.

6. An amplifier with separate AC and DC feedback loops as claimed in claim 5, in which said AC feedback means includes an RIAA feedback circuit.

7. An amplifier with separate AC and DC feedback loops as claimed in claim 1, in which said second transistor is a field effect transistor having gate, source and drain electrodes which correspond to said first, second and third electrodes of said second transistor, respectively.

8. An amplifier with separate AC and DC feedback loops according to claim 1, which further includes circuit means for changing over the voltage gain of said amplifier.

9. An amplifier with separate AC and DC feedback loops according to claim 8, in which said circuit means comprises:
   (a) a series connection of a capacitor and a first resistor, said series connection being connected between the second electrode of said first transistor and a reference point; and
   (b) a series connection of an ON and OFF switch and a second resistor, said series connection being connected between the connection point between said first capacitor and first resistor and said reference point, respectively.

10. An amplifier with separate AC and DC feedback loops according to claim 9, in which the resistance of said first resistor is selected larger than that of said second resistor.

11. An amplifier with separate AC and DC feedback loops according to claim 10, in which the voltage gain of said amplifier increases when said ON and OFF switch is closed.

* * * * *